(12) United States Patent
Shuto

(10) Patent No.: US 11,828,773 B2
(45) Date of Patent: Nov. 28, 2023

(54) ELECTRICAL CONNECTING DEVICE

(71) Applicant: Kabushiki Kaisha Nihon Micronics, Tokyo (JP)

(72) Inventor: Akihiro Shuto, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 256 days.

(21) Appl. No.: 17/417,301

(22) PCT Filed: Dec. 20, 2019

(86) PCT No.: PCT/JP2019/050051
§ 371 (c)(1),
(2) Date: Jun. 22, 2021

(87) PCT Pub. No.: WO2020/137863
PCT Pub. Date: Jul. 2, 2020

(65) Prior Publication Data
US 2022/0074971 A1    Mar. 10, 2022

(30) Foreign Application Priority Data
Dec. 26, 2018   (JP) ................................. 2018-242808

(51) Int. Cl.
  *G01R 1/073*   (2006.01)
  *G01R 1/067*   (2006.01)
(52) U.S. Cl.
  CPC ..... *G01R 1/07314* (2013.01); *G01R 1/06755* (2013.01); *G01R 1/06722* (2013.01)
(58) Field of Classification Search
  CPC ............ G01R 1/07314; G01R 1/06722; G01R 1/06755
  See application file for complete search history.

(56) References Cited

U.S. PATENT DOCUMENTS 7,420,383 B2   9/2008  Yoshida
2002/0132514 A1   9/2002  Feldman
(Continued)

FOREIGN PATENT DOCUMENTS

EP   0569509 A1   11/1993
JP   S6296578 U   6/1987
(Continued)

OTHER PUBLICATIONS

English translation of JPS62-096578 (Year: 1987).*
EPO, European Search Report, Application No. EP 19901981.1, dated Aug. 30, 2022.

*Primary Examiner* — Paresh Patel
(74) *Attorney, Agent, or Firm* — Lorenz & Kopf, LLP

(57) ABSTRACT

An electrical connecting device includes an insulating probe including a bottom-side plunger, a top-side plunger, and a barrel, and a probe head including a combined guide plate having a conductive region made of a conductive material and an insulating region made of an insulating material arranged adjacent to each other in a planar view. The bottom-side plunger and the top-side plunger are electrically connected to each other inside the barrel, and the bottom-side plunger and the top-side plunger are electrically insulated from the barrel. The probe head holds the insulating probe in a state in which the barrel penetrates through the conductive region. The barrel of the insulating probe is connected to a ground potential via the conductive region when an inspection object is measured.

12 Claims, 10 Drawing Sheets

(56) References Cited

U.S. PATENT DOCUMENTS

| | | |
|---|---|---|
| 2004/0053539 A1 | 3/2004 | Watanabe |
| 2008/0139017 A1 | 6/2008 | Kiyofuji et al. |
| 2010/0244872 A1 | 9/2010 | Yoshida et al. |
| 2015/0015289 A1 | 1/2015 | Eldridge |
| 2018/0196086 A1 | 7/2018 | Eldridge |

FOREIGN PATENT DOCUMENTS

| | | |
|---|---|---|
| JP | H0718274 U | 3/1995 |
| JP | 2004047376 A | 2/2004 |
| JP | 2007178164 A | 7/2007 |
| JP | 2007198835 A | 8/2007 |
| JP | 2007248237 A | 9/2007 |
| JP | 2010151732 A | 7/2010 |
| JP | 2010237133 A | 10/2010 |
| JP | 2010281583 A | 12/2010 |
| JP | 2012159422 A | 8/2012 |
| JP | 2014173914 A | 9/2014 |
| JP | 2016524169 A | 8/2016 |
| JP | 2017096646 A | 6/2017 |
| TW | 201435349 A | 9/2014 |
| WO | WO2012106220 A1 | 8/2012 |
| WO | WO 2018147024 A1 | 8/2018 |

\* cited by examiner

ELECTRICAL CONNECTING DEVICE

TECHNICAL FIELD

The present invention relates to an electrical connecting device used for measuring the characteristics of an inspection object.

BACKGROUND ART

An electrical connecting device including probes is used to measure the characteristics of an integrated circuit and the like in a state of not being separated from a wafer. The inspection by use of the electrical connecting device is made such that one ends of the respective probes are brought into contact with pads for measurement of an inspection object, while the other ends of the respective probes are brought into contact with terminals (referred to below as "lands") provided on a wired substrate. The lands are electrically connected to a measurement device such as a tester. A current is caused to flow through the inspection object via the probes so as to inspect the electrical characteristics of the inspection object.

The inspection using the probes needs to ensure the electrical connection of the inspection object and the lands with the probes. This requires the probes to be designed to simultaneously achieve a probe load corresponding to a material used for the pads for measurement and a stroke amount sufficient to avoid an influence by variation in height of the pads for measurement so as to obtain a stable contact resistance between the pads for measurement of the inspection object and the probes. For example, overdrive (OD) is applied so as to strongly press the probes against the inspection object, or the probes are elastically deformed so as to apply a preload to the probes and the lands. Another structure is known in which probes are provided with slit-shaped cuts on side surfaces to form elastically-deformable spring parts (refer to Patent Literature 1).

CITATION LIST

Patent Literature

Patent Literature 1: Japanese Unexamined Patent Application Publication No. 2010-281583

SUMMARY OF THE INVENTION

Technical Problem

The entire length of the probes is inevitably increased if a length of the spring parts, for example, is increased so as to ensure the electrical connection of the inspection object and the lands with the probes. The increase in the entire length of the probes impedes the measurement of the high-frequency characteristics of the inspection object with a high accuracy.

In response to this issue, the present invention provides an electrical connecting device capable of ensuring a stable electrical connection between an inspection object and probes and measuring the high-frequency characteristics of the inspection object with a high accuracy.

Solution to Problem

An aspect of the present invention provides an electrical connecting device including an insulating probe including a barrel, a top-side plunger, and a bottom-side plunger, the top-side plunger and the bottom-side plunger being electrically insulated from the barrel and electrically connected to each other inside the barrel, and a combined guide plate having a conductive region and an insulating region arranged adjacent to each other in a planar view, wherein the barrel of the insulating probe is connected to a ground potential via the conductive region.

Advantageous Effects of the Invention

The present invention can provide the electrical connecting device capable of ensuring a stable electrical connection between the inspection object and the probe and measuring the high-frequency characteristics of the inspection object with a high accuracy.

DESCRIPTION OF EMBODIMENTS

Figure 1:
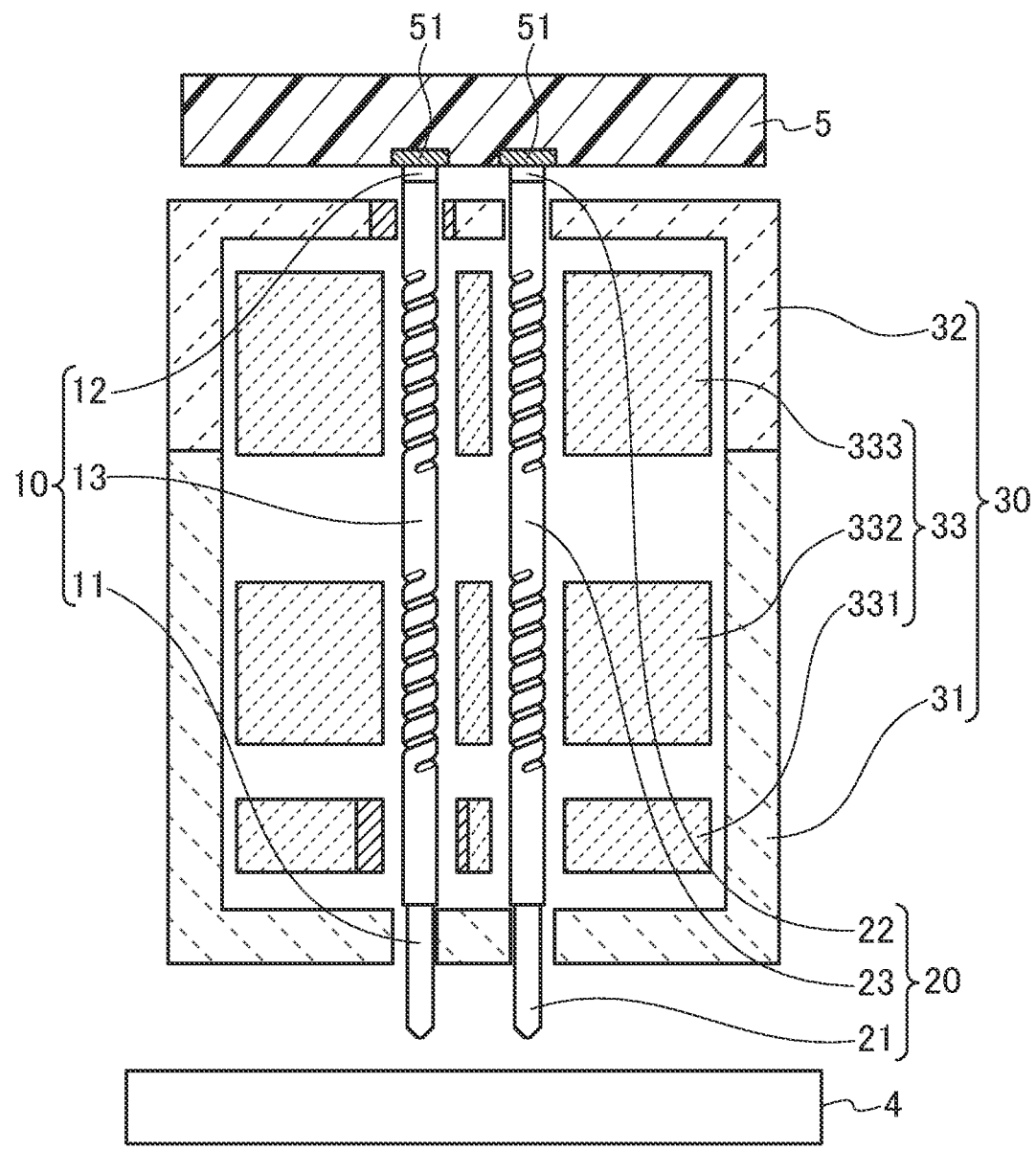
FIG. 1 is a schematic diagram illustrating a structure of an electrical connecting device according to a first embodiment of the present invention.

Embodiments of the present invention are described below with reference to the drawings. The same or similar elements illustrated in the drawings are denoted below by the same or similar reference numerals. It should be understood that the drawings are illustrated schematically, and the proportions of the length and the thickness of the respective elements in the drawings are not drawn to scale. It should also be understood that the dimensional relationships and proportions between the respective drawings can differ from each other.

First Embodiment

An electrical connecting device according to a first embodiment of the present invention includes an insulating probe 10 and a conductive probe 20 each having a stick-like shape, and a probe head 30 that holds the insulating probe 10 and the conductive probe 20, as illustrated in FIG. 1. The insulating probe 10 and the conductive probe 20 are also collectively referred to below as "probes". The electrical connecting device illustrated in FIG. 1 is a vertical operation-type probe card used for measuring the electrical characteristics of an inspection object 4, in which one ends of the respective probes are brought into contact with pads for measurement (not illustrated) of the inspection object 4 when measured. FIG. 1 illustrates a state in which the probes are not in contact with the inspection object 4. The other ends of the probes are in contact with lands 51 provided on a printed substrate 5. The lands 51 are electrically connected to a measurement device such as a tester (not illustrated), so that the electrical connecting device is used for determining the electrical characteristics of the inspection object 4.

The insulating probe 10 includes a tubular barrel 13, a bottom-side plunger 11, and a top-side plunger 12. As indicated by the arrows in FIG. 2, a proximal end part of the bottom-side plunger 11 is inserted to one end of the barrel 13, and a proximal end part of the top-side plunger 12 is inserted to the other end of the barrel 13. The bottom-side plunger 11 and the top-side plunger 12 are joined with the barrel 13 by caulking or an adhesive for example.

The barrel 13 is provided with spiral slits penetrating the side surface. The regions provided with the slits serve as spring parts so as to allow the insulating probe 10 to flexibly extend and contract in the axial direction. Upon the measurement of the inspection object 4, a tip end part of the insulating probe 10 is fixed to the land 51, while the insulating probe 10 extends and contracts such that the other tip end part of the insulating probe 10 in contact with the inspection object 4 moves in the axial direction.

Figure 2:
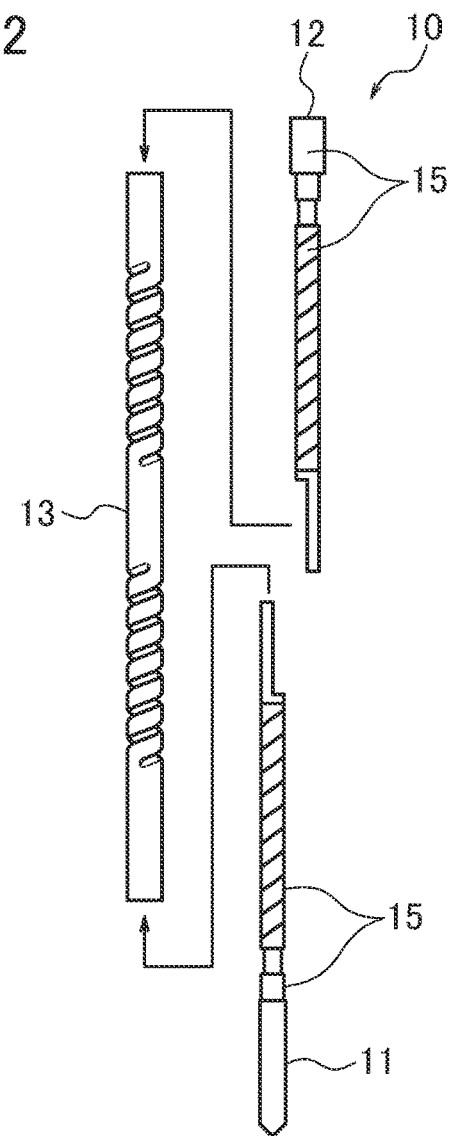
FIG. 2 is a schematic diagram illustrating a structure of an insulating probe of the electrical connecting device according to the first embodiment of the present invention.

The bottom-side plunger 11 and the top-side plunger 12 are electrically connected together inside the barrel 13. For example, as illustrated in FIG. 2, the proximal end part of the bottom-side plunger 11 and the proximal end part of the top-side plunger 12 are each formed to have a semicircular notch. The bottom-side plunger 11 and the top-side plunger 12 slide inside the barrel 13 while the flat surfaces of the respective notches are in contact with each other. In other words, the side surfaces of the respective proximal end parts opposed to each other serve as a current path between the bottom-side plunger 11 and the top-side plunger 12. The bottom-side plunger 11 and the top-side plunger 12 are coated with insulating material 15 at the parts each opposed to the barrel 13 so that the bottom-side plunger 11 and the top-side plunger 12 are electrically insulated from the barrel 13. For example, the surfaces of the bottom-side plunger 11 and the top-side plunger 12 are coated with the insulating material 15 excluding the parts in contact with the pads for measurement of the inspection object 4, the parts in contact with the lands 51, and the flat surfaces of the notches at the proximal end parts.

Figure 3:
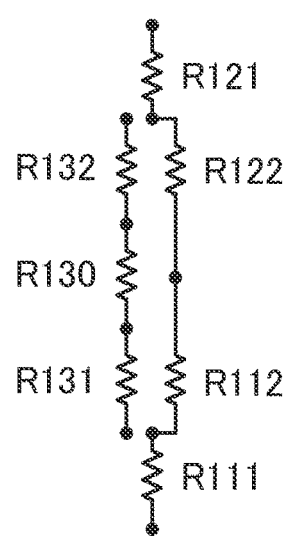
FIG. 3 is a schematic diagram illustrating an electrical configuration of the insulating probe illustrated in FIG. 2.

FIG. 3 is a diagram illustrating an electrical configuration of the insulating probe 10. FIG. 3 indicates a resistor R111 that is an electric resistor corresponding to the tip end part of the bottom-side plunger 11, and a resistor R112 that is an electric resistor corresponding to the proximal end part of the bottom-side plunger 11. FIG. 3 also indicates a resistor R121 that is an electric resistor corresponding to the tip end part of the top-side plunger 12, and a resistor R122 that is an electric resistor corresponding to the proximal end part of the top-side plunger 12. FIG. 3 also indicates a resistor R130 that is an electric resistor corresponding to a part of the barrel 13 excluding the spring parts, a resistor R131 that is an electric resistor corresponding to the spring part on the bottom side of the barrel 13, and a resistor R132 that is a resistor corresponding to the spring part on the top side of the barrel 13.

A Ag—Pd—Cu material is used for the bottom-side plunger 11 and the top-side plunger 12, for example. A Ni material is used for the barrel 13, for example.

Figure 4:
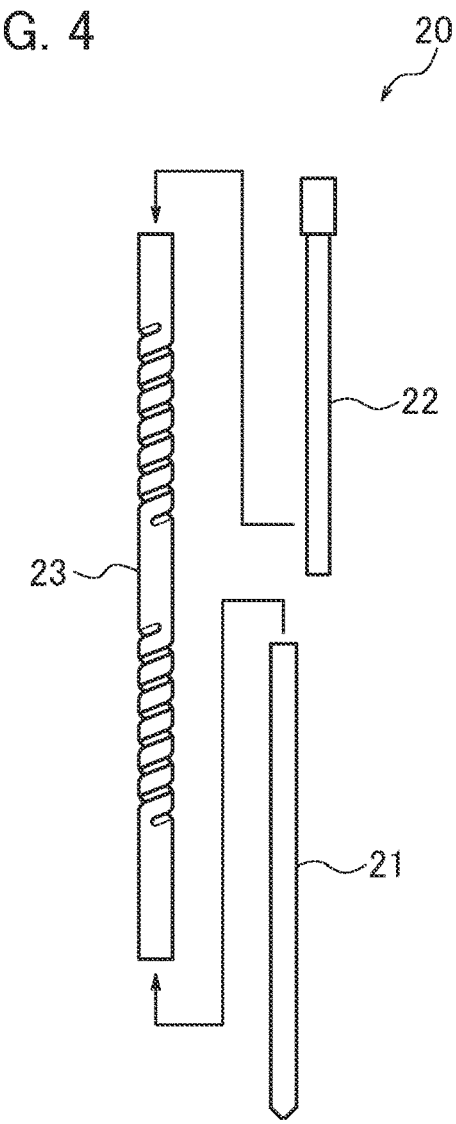
FIG. 4 is a schematic diagram illustrating a structure of a conductive probe of the electrical connecting device according to the first embodiment of the present invention.

The conductive probe 20 in the electrical connecting device illustrated in FIG. 1 has a configuration, for example, in which a proximal end part of a bottom-side plunger 21 is inserted to one end of a barrel 23, and a proximal end part of a top-side plunger 22 is inserted to the other end of the barrel 23, as illustrated in FIG. 4. A tip end part of the bottom-side plunger 21 is brought into contact with the pad for measurement of the inspection object 4, and a tip end part of the top-side plunger 22 is brought into contact with the land 51. The bottom-side plunger 21 and the top-side plunger 22 are electrically connected to the barrel 23. The conductive probe 20 thus has a conductivity continuously between the one end in contact with the inspection object 4 and the other end connected to the land 51. The bottom-side plunger 21 and the top-side plunger 22 are joined with the barrel 23 by caulking or an adhesive, or by spot welding, for example. The barrel 23 is provided with spring parts of spiral slits, so as to allow the conductive probe 20 to flexibly extend and contract in the axial direction.

Figure 5:
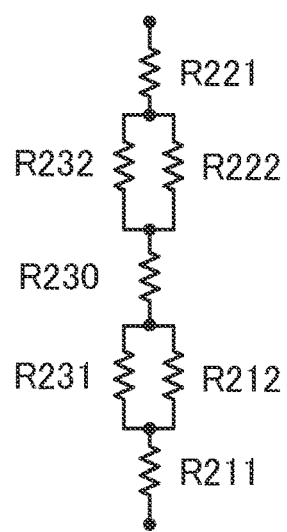
FIG. 5 is a schematic diagram illustrating an electrical configuration of the conductive probe illustrated in FIG. 4.

FIG. 5 is a diagram illustrating an electrical configuration of the conductive probe 20. A resistor R211 is an electric resistor corresponding to the tip end part of the bottom-side plunger 21, and a resistor R212 is an electric resistor corresponding to the proximal end part of the bottom-side plunger 21. A resistor R221 is an electric resistor corresponding to the tip end part of the top-side plunger 22, and a resistor R222 is an electric resistor corresponding to the proximal end part of the top-side plunger 22. A resistor R230 is an electric resistor corresponding to a part of the barrel 23 excluding the spring parts, a resistor R231 is an electric resistor corresponding to the spring part on the bottom side of the barrel 23, and a resistor R232 is a resistor corresponding to the spring part on the top side of the barrel 23.

The probe head 30 includes a plurality of guide plates arranged in the axial direction of the insulating probe 10 and the conductive probe 20, and holds the insulating probe 10 and the conductive probe 20 penetrating through guide holes provided in the respective guide plates. The probe head 30 illustrated in FIG. 1 includes, as the respective guide plates, a bottom guide plate 31 arranged on the bottom side located toward the inspection object 4, a top guide plate 32 arranged on the top side located toward the printed substrate 5, and a middle guide plate 33 interposed between the bottom guide plate 31 and the top guide plate 32. The bottom-side plunger 11 of the insulating probe 10 and the bottom-side plunger 21 of the conductive probe 20 penetrate through the bottom guide plate 31. The top-side plunger 12 of the insulating probe 10 and the top-side plunger 22 of the conductive probe 20 penetrate through the top guide plate 32. The barrel 13 of the insulating probe 10 and the barrel 23 of the conductive probe 20 penetrate through the middle guide plate 33. FIG. 1 illustrates the case in which the middle guide plate 33 of the probe head 30 includes a first middle guide plate 331, a second middle guide plate 332, and a third middle guide plate 333.

Figure 6:
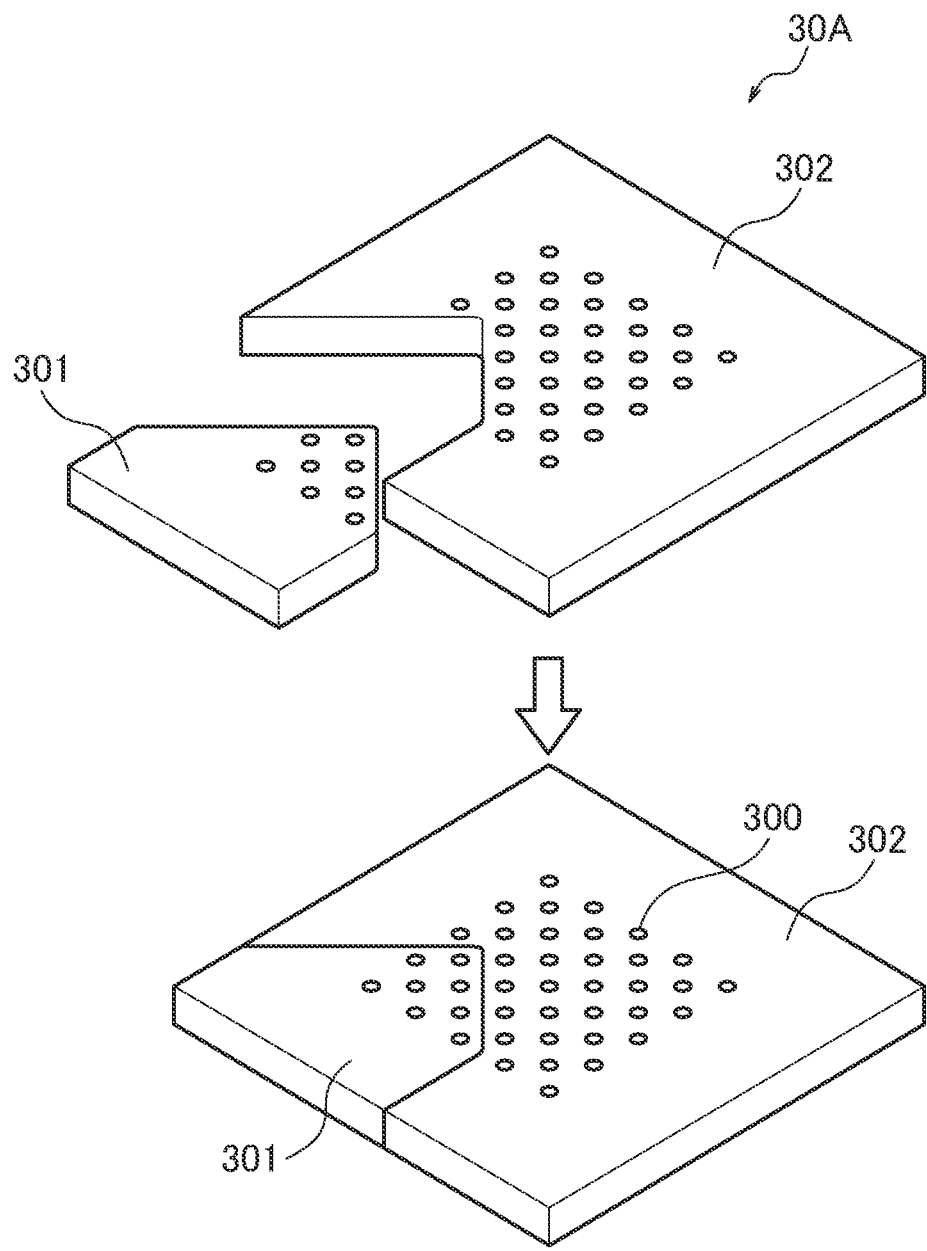
FIG. 6 is a schematic diagram illustrating a structure of a combined guide plate in the electrical connecting device according to the first embodiment of the present invention.

The probe head 30 includes a combined guide plate 30A having a structure as illustrated in FIG. 6 as at least one of the guide plates. The combined guide plate 30A has the structure in which a conductive region 301 made of a conductive material and an insulating region 302 made of an insulating material are arranged adjacent to each other in a planar view. The conductive material to be used is a metallic material such as copper or stainless steel. The insulating material to be used is a ceramic material, for example. The conductive region 301 is manufactured by electroforming or extension processing, guide holes 300 is provided by etching or laser processing, for example.

Figure 7:
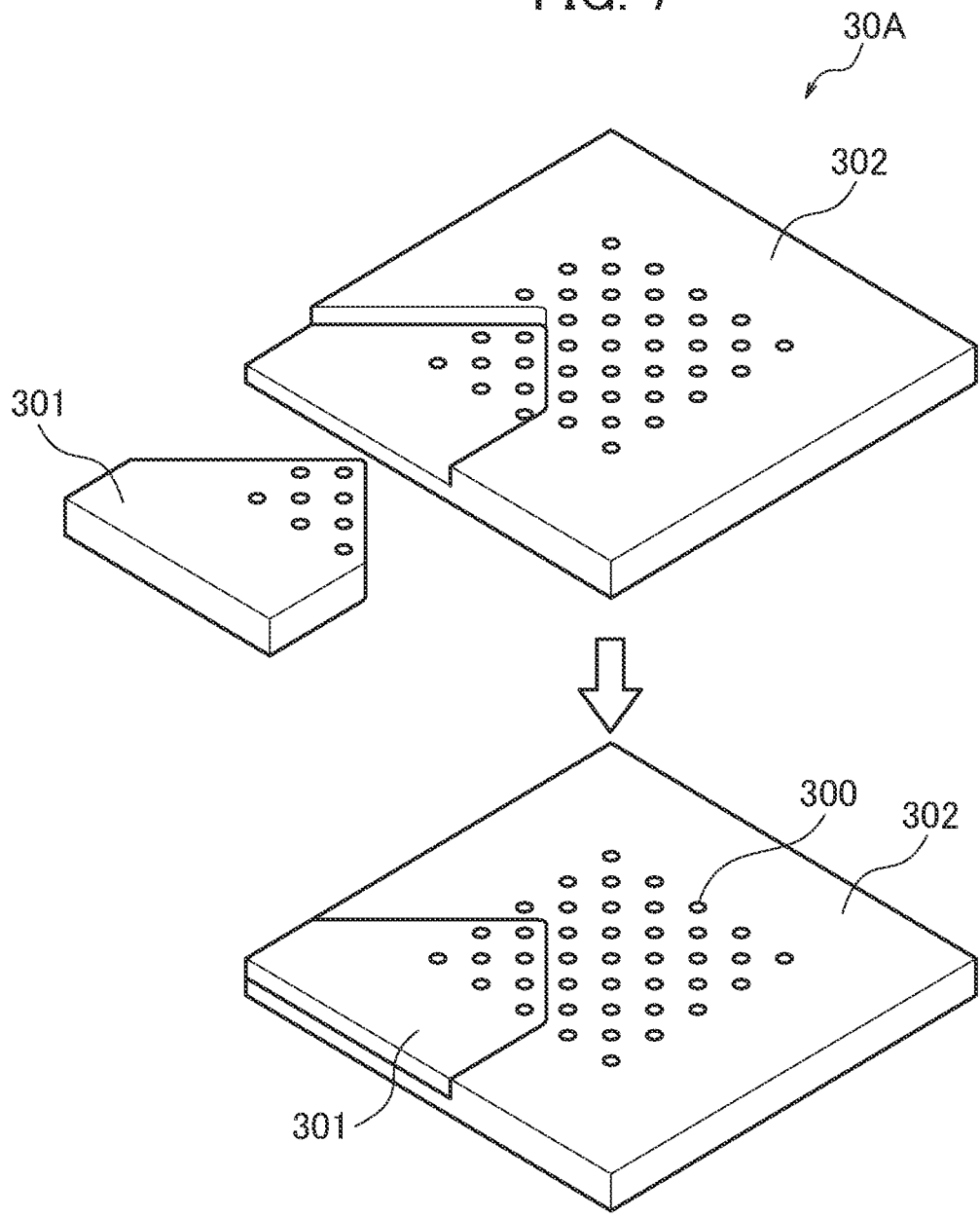
FIG. 7 is a schematic diagram illustrating another structure of the combined guide plate in the electrical connecting device according to the first embodiment of the present invention.

The conductive region 301 may be entirely made of the conductive material in the combined guide plate 30A as illustrated in FIG. 6, for example. Alternatively, only a part of the combined guide plate 30A in the thickness direction may be provided with the conductive region 301 as illustrated in FIG. 7.

The insulating probe 10 is held by the probe head 30 in the state in which the barrel 13 of the insulating probe 10 penetrates through the conductive region 301. The barrel 13 of the insulating probe 10 penetrates through the guide hole 300 provided in the conductive region 301. The shape of the conductive region 301 in a planar view is determined as appropriate, and the conductive region 301 is arranged in a region in which the insulating probe 10 penetrates through the combined guide plate 30A. The conductive probe 20 is held by the probe head 30 in the state in which the barrel 23 penetrates through the guide hole 300 provided in the insulating region 302.

Figure 8:
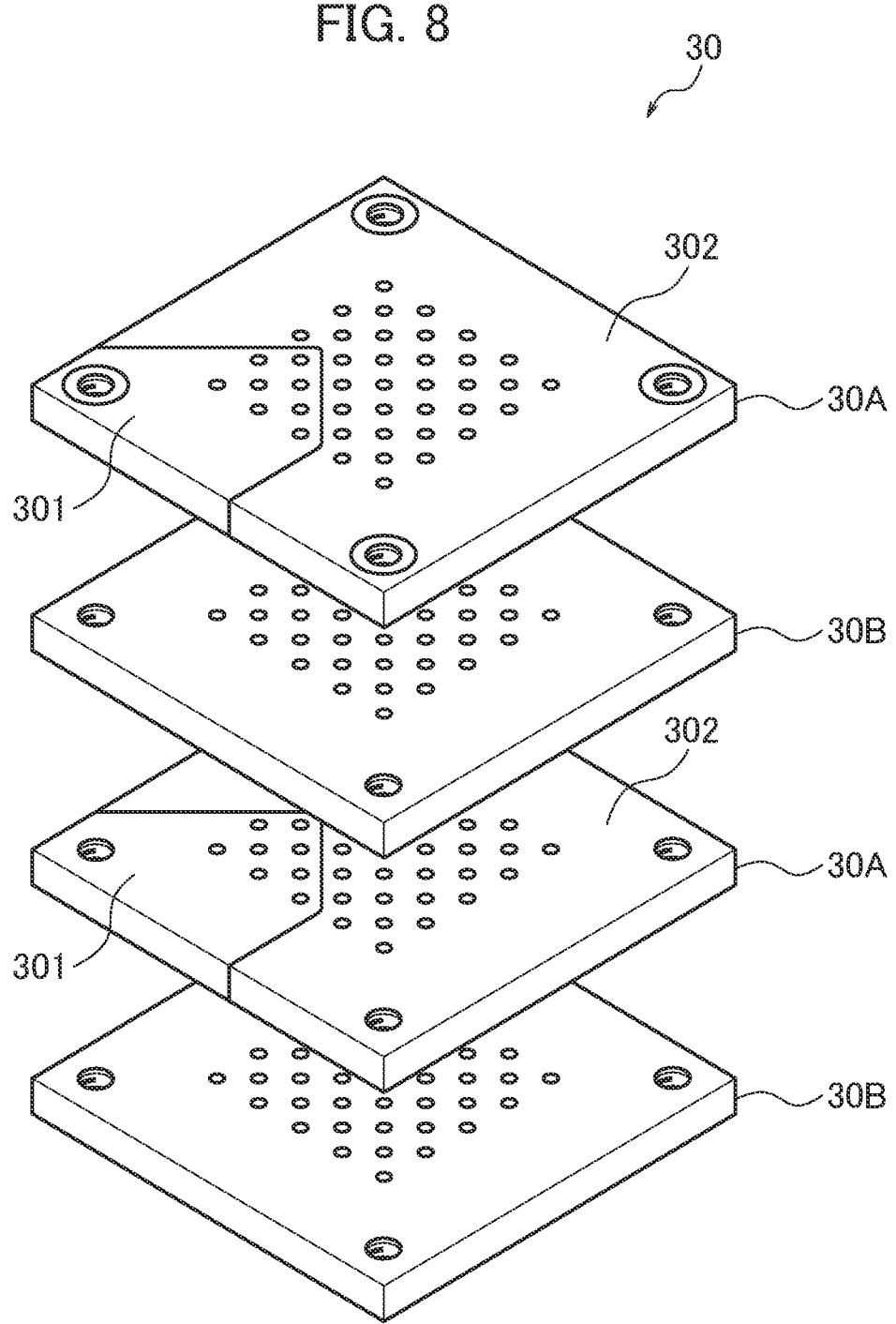
FIG. 8 is a schematic diagram illustrating a structure of a probe head in the electrical connecting device according to the first embodiment of the present invention.

The plural guide plates including the combined guide plate 30A and the insulating guide plate 30B entirely made of the insulating material can be arranged in the axial direction of the probes to form the probe head 30. The combined guide plate 30A may be used as a part of the guide plates included in the probe head 30, and the insulating guide plate 30B may be used as the other guide plates. FIG. 8 illustrates an example of the probe head 30 having a structure in which the combined guide plates 30A and the insulating guide plates 30B are alternately arranged and stacked on one another. The present embodiment may determine as appropriate which guide plate is replaced with the combined guide plate 30A in the plural guide plates. At least one combined guide plate 30A only needs to be used in the guide plates included in the probe head 30. The insulating guide plate 30B is made of a ceramic material, for example.

Figure 9:
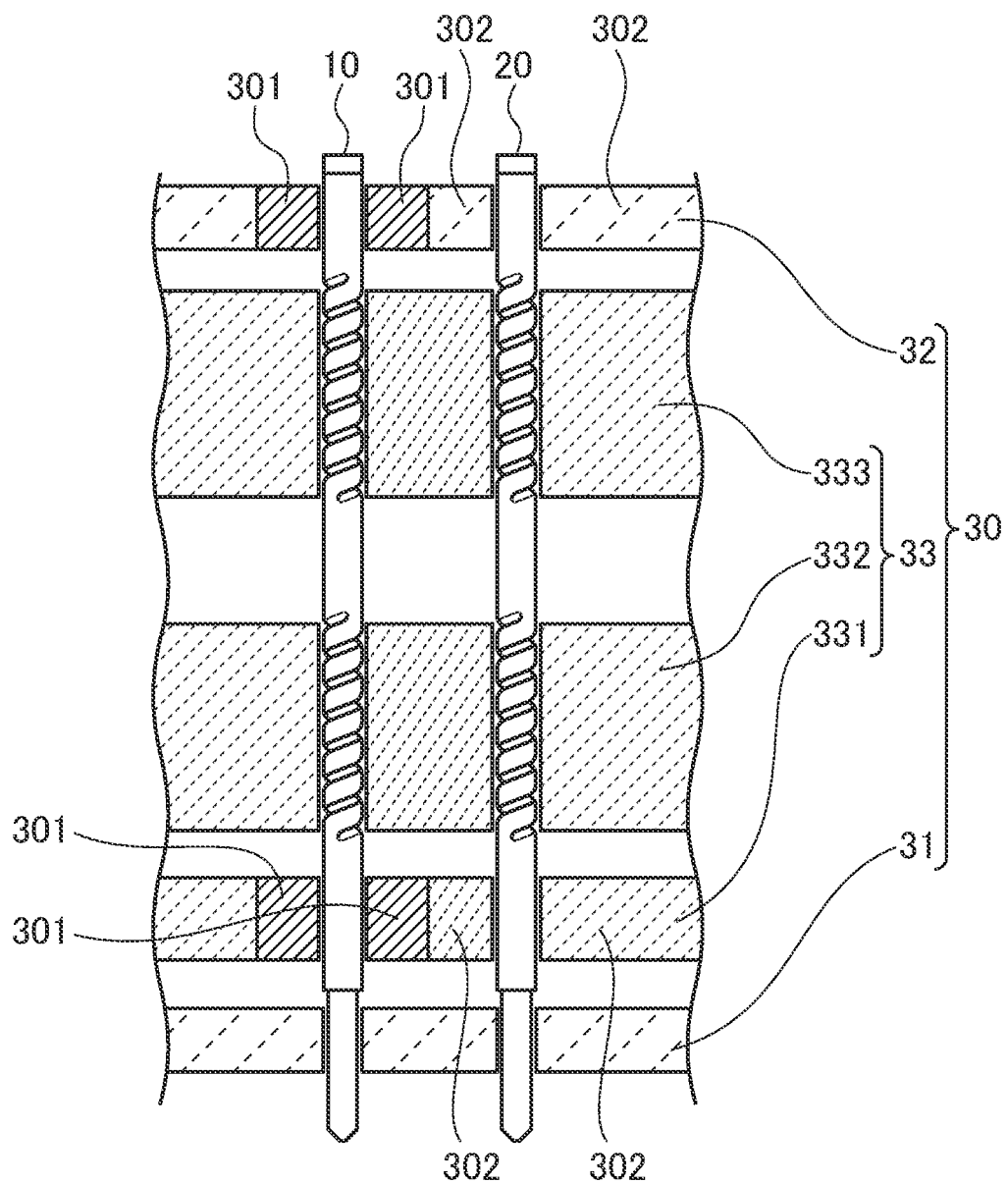
FIG. 9 is a schematic diagram showing an example in which the probe head holds the insulating probe and the conductive probe in the electrical connecting device according to the first embodiment of the present invention.

FIG. 9 illustrates a case in which the probe head 30 including both the combined guide plate 30A and the insulating guide plate 30B holds the insulating probe 10 and the conductive probe 20. The combined guide plate 30A is used as the top guide plate 32 and as the first middle guide plate 331 of the middle guide plates 33 closest to the bottom guide plate 31. The insulating guide plate 30B is used as the bottom guide plate 31, the second middle guide plate 332, and the third middle guide plate 333. The combined guide plate 30A may be used for all of the middle guide plates 33.

The insulating probe 10 is connected to the pad for measurement to which a high-frequency signal of the inspection object 4 is transmitted upon the measurement of the inspection object 4. The conductive region 301 is set to a ground potential, so that the barrel 13 of the insulating probe 10 is connected to the ground potential via the conductive region 301. Since the barrel 13 connected to the ground potential is configured to be arranged at the circumference of the bottom-side plunger 11 and the top-side plunger 12 through which the high-frequency signal is transmitted, the insulating probe 10 can stably transmit the high-frequency signal regardless of whether the entire length of the probe is increased, for example. The use of the insulating probe 10 for the transmission of the high-frequency signal thus can allow the electrical connecting device as illustrated in FIG. 1 to be suitably used for the measurement including the high-frequency signal. The frequency of the high-frequency signal transmitted through the insulating probe 10 is set to about 10 to 15 GHz, for example. The conductive probe 20 is used for the transmission of the electrical signal other than the high-frequency signal, and is used for setting a ground electrode and a power source electrode of the inspection object 4 each to a predetermined potential.

For example, the inner wall surface of the guide hole 300 provided in the conductive region 301 connected to the ground potential is brought into contact with the outer surface of the barrel 13 of the insulating probe 10, so that the barrel 13 of the insulating probe 10 is connected to the ground potential. The insulating probe 10 is caused to be bent when brought into contact with the inspection object 4, so as to bring the outer surface of the barrel 13 of the insulating probe 10 into contact with the inner wall surface of the guide hole 300 of the conductive region 301. For example, the combined guide plate 30A is arranged at a part at which the bent amount of the insulating probe 10 is large when brought into contact with the inspection object 4 and applied with overdrive.

Figure 10:
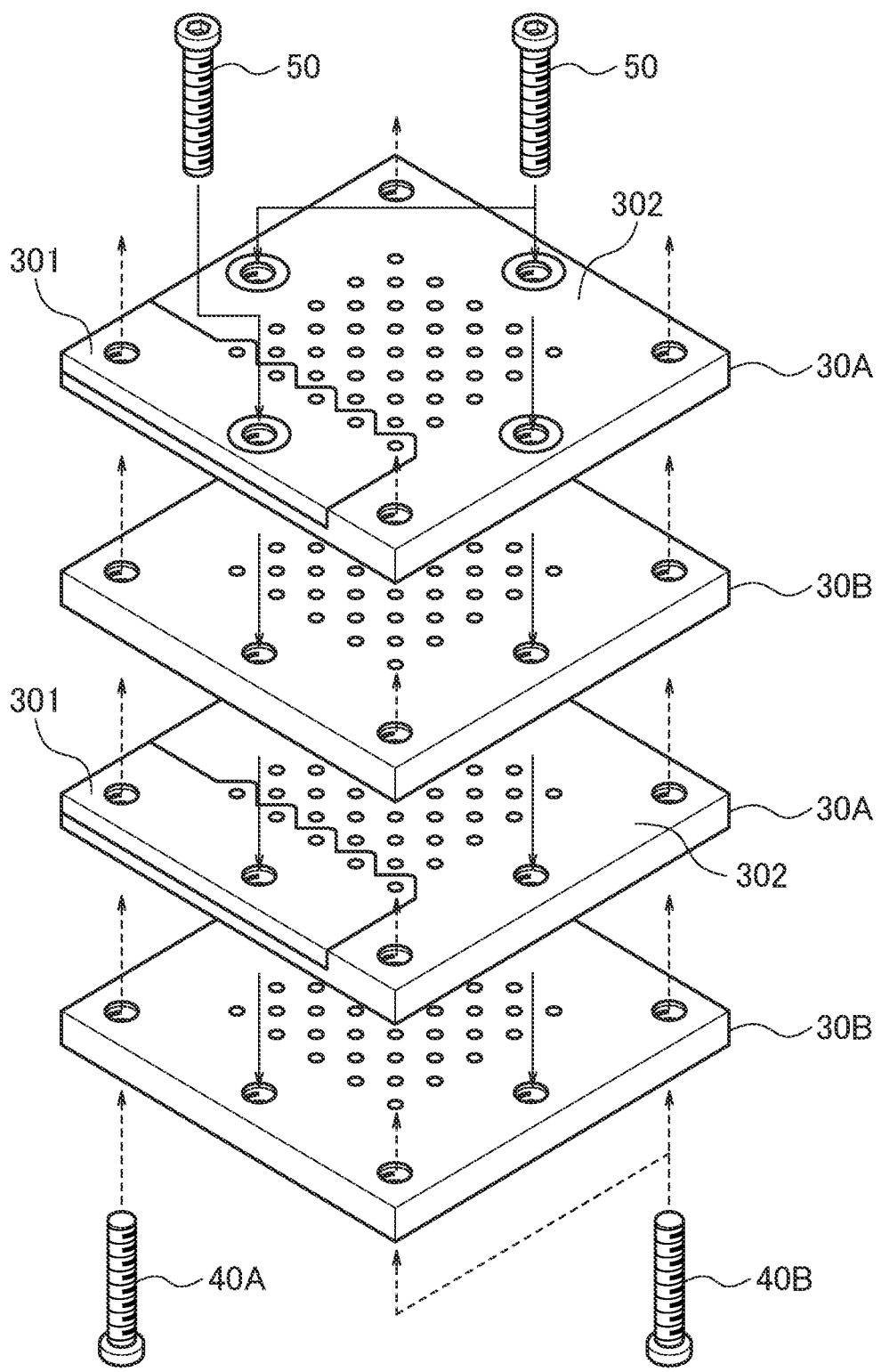
FIG. 10 is a schematic diagram showing an example of a structure in which a conductive region of the combined guide plate in the electrical connecting device according to the first embodiment of the present invention is set to a ground potential.

Various kinds of methods can be employed to set the conductive region 301 to the ground potential. For example, FIG. 10 illustrates a case of including a fixing pin 40A penetrating through the conductive region 301 and used for fixing the probe head 30 to the printed substrate 5 and a fixing pin 40B penetrating through the insulating region 302, in which the fixing pin 40A is used for setting the conductive region 301 to the ground potential. In particular, the probe head 30 is fixed to the printed substrate 5 with the fixing pin 40A so as to bring the conductive fixing pin 40A into contact with the ground electrode of the printed substrate 5. The use of the fixing pin 40A penetrating through the conductive region 301 allows the conductive region 301 to be connected to the ground potential via the fixing pin 40A. The fixing pin 40A is a screw, for example, so as to accurately ensure the electrical connection between the fixing pin 40A and the conductive region 301. FIG. 10 also illustrates assembly screws 50 used for assembling the respective guide plates to form the probe head 30.

As described above, the electrical connecting device according to the first embodiment of the present invention can stably transmit the high-frequency signal due to the insulating probe 10 including the barrel 13 connected to the ground potential. The insulating probe 10 has the structure that can avoid a decrease in the high-frequency characteristics regardless of whether the entire length of the probes is increased. The electrical connecting device as illustrated in FIG. 1 thus can ensure a stable connection between the inspection object 4 and the probes, and can measure the high-frequency characteristics of the inspection object 4 with a high accuracy.

Modified Example

Figure 11:
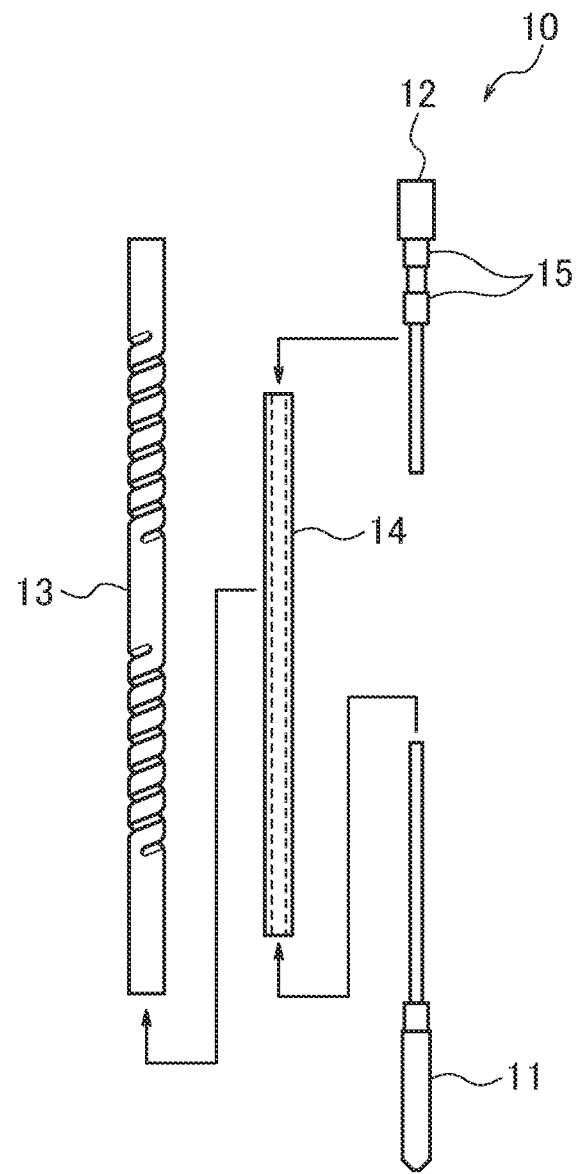
FIG. 11 is a schematic diagram illustrating another structure of the insulating probe in the electrical connecting device according to the first embodiment of the present invention.

The insulating probe 10 of the electrical connecting device according to a modified example of the first embodiment includes a tubular intermediate plunger 14 having one end to which the proximal end part of the bottom-side plunger 11 is inserted and the other end to which the proximal end part of the top-side plunger 12 is inserted, as illustrated in FIG. 11. The intermediate plunger 14 is made of a conductive material, and is arranged inside the barrel 13.

The bottom-side plunger 11 and the top-side plunger 12 are electrically connected to each other via the intermediate plunger 14. The intermediate plunger 14 thus serves as a current path between the bottom-side plunger 11 and the top-side plunger 12. The intermediate plunger 14 is made of the same material as the bottom-side plunger 11 and the top-side plunger 12. The intermediate plunger 14 is manufactured by extension processing or electroforming.

A part of the intermediate plunger 14 opposed to the barrel 13 is coated with an insulating material. This electrically insulates the bottom-side plunger 11 and the top-side plunger 12 from the barrel 13.

For example, the proximal end part of the top-side plunger 12 is inserted to one end of the intermediate plunger 14 on the other side on which the bottom-side plunger 11 is fixed to bring the intermediate plunger 14 into contact with the top-side plunger 12. The proximal end part of the top-side plunger 12 is configured to slide inside the intermediate plunger 14, so as to allow the insulating probe 10 in contact with the inspection object 4 to extend and contract in the axial direction. Alternatively, the proximal end part of the bottom-side plunger 11 is inserted to one end of the intermediate plunger 14 on the other side on which the top-side plunger 12 is fixed to bring the intermediate plunger 14 into contact with the bottom-side plunger 11. Alternatively, a spring or the like may be used so as to allow the intermediate plunger 14 to flexibly extend and contract in the axial direction. The fixation of the bottom-side plunger 11 and the top-side plunger 12 with the intermediate plunger 14 may be made by spot welding or caulking.

Second Embodiment

Figure 12:
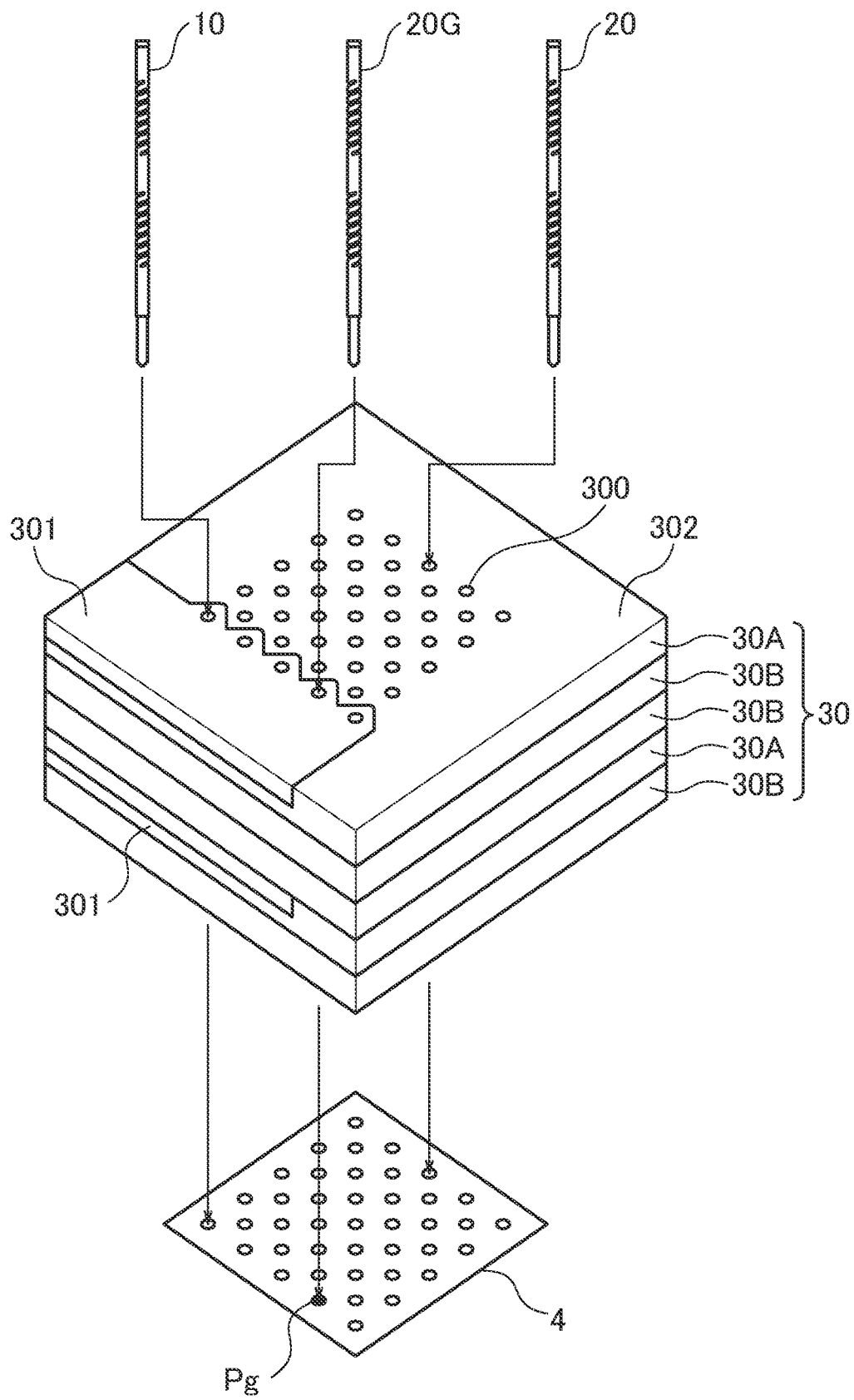
FIG. 12 is a schematic diagram showing an example of a structure in which a conductive region of a combined guide plate in an electrical connecting device according to a second embodiment of the present invention is set to a ground potential.

An electrical connecting device according to a second embodiment of the present invention further includes a conductive probe 20G that penetrates through the guide hole 300 provided in the conducting region 301 of the respective combined guide plates 30A and is brought into contact with a ground electrode Pg of the inspection object 4, as illustrated in FIG. 12. FIG. 12 illustrates the ground electrode Pg indicated by the black dot different from the other pads for measurement indicated by the white dots. The conductive probe 20G has the same structure as the conductive probe 20 having a conductivity continuously from one end to the other end. The conductive probe 20G is set to the ground potential via the land 51. For example, the conductive probe 20G is connected to a ground potential region of the printed substrate 5 prepared for setting the ground electrode of the inspection object 4 to the ground potential. The land 51 to which the conductive probe 20G is connected may be set to the ground potential in accordance with the setting of the measurement device such as a tester.

The electrical connecting device illustrated in FIG. 12 differs from the first embodiment in connecting the barrel 13 of the insulating probe 10 to the ground potential by use of the probe for setting the ground electrode Pg of the inspection object 4 to the ground potential. The other configurations are the same as those in the first embodiment.

In the electrical connecting device illustrated in FIG. 12, the conductive probe 20G in contact with the ground electrode Pg of the inspection object 4 is brought into contact with the conductive region 301. For example, the conductive probe 20G is caused to be bent upon the measurement of the inspection object 4 so as to bring the outer surface of the conductive probe 20G into contact with the inner wall surface of the guide hole 300 of the conductive region 301 of the respective combined guide plates 30A. This causes the barrel 13 of the insulating probe 10 to be connected to the ground potential via the conductive probe 20G and the conductive region 301. The high-frequency signal is thus stably transmitted through the insulating probe 10 accordingly.

As described above, the electrical conducting device according to the second embodiment leads the barrel 13 of the insulating probe 10 to be connected to the ground potential via the conductive probe 20G. The electrical conducting device thus can ensure the stable connection between the inspection object 4 and the probes, and measure the high-frequency characteristics of the inspection object 4 with a high accuracy. The other effects are substantially the same as those in the first embodiment, and overlapping explanations are not repeated below.

Other Embodiments

While the present invention has been described above with reference to the respective embodiments, it should be understood that the present invention is not intended to be limited to the descriptions and the drawings composing part of this disclosure. Various alternative embodiments, examples, and technical applications will be apparent to those skilled in the art according to this disclosure.

For example, the ground electrode of the printed substrate 5 and the conductive region 301 of the combined guide plate 30A may be directly connected to each other via a wire.

It should be understood that the present invention includes various embodiments not disclosed herein.

What is claimed is:

1. An electrical connecting device used for measuring an inspection object, the device comprising:

an insulating probe including a tubular barrel, a bottom-side plunger having a proximal end part inserted to one end of the barrel, and a top-side plunger having a proximal end part inserted to another end of the barrel, the bottom-side plunger and the top-side plunger being electrically connected to each other inside the barrel, the bottom-side plunger and the top-side plunger being electrically insulated from the barrel; and a probe head including a combined guide plate having a conductive region made of a conductive material and an insulating region made of an insulating material arranged adjacent to each other in a planar view, the probe head holding the insulating probe in a state in which the barrel penetrates through the conductive region, wherein the barrel of the insulating probe is connected to a ground potential via the conductive region when the inspection object is measured, wherein an inner wall surface of a guide hole provided in the conductive region connected to the ground potential is brought into contact with an outer surface of the barrel of the insulating probe penetrating through the guide hole so as to lead the barrel of the insulating probe to be connected to the ground potential, and wherein the insulating probe is caused to be bent when brought into contact with the inspection object so as to bring the inner wall surface of the guide hole of the conductive region into contact with the outer surface of the barrel of the insulating probe.

2. The electrical connecting device according to claim 1, wherein the bottom-side plunger and the top-side plunger are each coated with an insulating material at a part opposed to the barrel.

3. The electrical connecting device according to claim 1, wherein the proximal end part of the bottom-side plunger and the proximal end part of the top-side plunger having side surfaces opposed to each other slide inside the barrel while the side surfaces come into contact with each other.

4. The electrical connecting device according to claim 1, wherein the insulating probe comprises a conductive intermediate plunger having a tubular shape having one end to which the proximal end part of the bottom-side plunger is inserted and another end to which the proximal end part of the top-side plunger is inserted, the intermediate plunger being arranged inside the barrel, and
the top-side plunger and the bottom-side plunger are electrically connected to each other via the intermediate plunger.

5. The electrical connecting device according to claim 1, further comprising a conductive fixing pin used for fixing the probe head to a printed substrate,
wherein the fixing pin connected to a ground electrode of the printed substrate penetrates through the conductive region, and the barrel of the insulating probe is connected to the ground potential via the fixing pin and the conductive region.

6. The electrical connecting device according to claim 1, further comprising a conductive probe having a conductivity continuously from one end brought into contact with the inspection object to another end,
wherein the conductive probe in contact with a ground electrode of the inspection object penetrates through the conductive region, and the barrel of the insulating probe is connected to the ground potential via the conductive probe and the conductive region when the inspection object is measured.

7. The electrical connecting device according to claim 1, wherein the probe head has a structure in which a plurality of guide plates including the combined guide plate and an insulating guide plate entirely made of an insulating material are arranged in an axial direction of the insulating probe.

8. The electrical connecting device according to claim 7, wherein the probe head has the structure in which
a bottom guide plate arranged on a bottom side is the insulating guide plate,
a top guide plate arranged on a top side is the combined guide plate, and
a middle guide plate of a plurality of middle guide plates arranged closest to the bottom guide plate is the combined guide plate, the plurality of middle guide plates being interposed between the bottom guide plate and the top guide plate.

9. The electrical connecting device according to claim 1, wherein the insulating probe is used for transmitting a high-frequency signal.

10. The electrical connecting device according to claim 1, wherein the barrel has a structure capable of flexibly extending and contracting in an axial direction of the insulating probe.

11. An electrical connecting device used for measuring an inspection object, the device comprising:
an insulating probe including a tubular barrel, a bottom-side plunger having a proximal end part inserted to one end of the barrel, and a top-side plunger having a proximal end part inserted to another end of the barrel, the bottom-side plunger and the top-side plunger being electrically connected to each other inside the barrel, the bottom-side plunger and the top-side plunger being electrically insulated from the barrel;
a probe head including a combined guide plate having a conductive region made of a conductive material and an insulating region made of an insulating material arranged adjacent to each other in a planar view, the probe head holding the insulating probe in a state in which the barrel penetrates through the conductive region; and
a conductive fixing pin used for fixing the probe head to a printed substrate;
wherein the barrel of the insulating probe is connected to a ground potential via the conductive region when the inspection object is measured; and
wherein the fixing pin connected to a ground electrode of the printed substrate penetrates through the conductive region, and the barrel of the insulating probe is connected to the ground potential via the fixing pin and the conductive region.

12. An electrical connecting device used for measuring an inspection object, the device comprising:
an insulating probe including a tubular barrel, a bottom-side plunger having a proximal end part inserted to one end of the barrel, and a top-side plunger having a proximal end part inserted to another end of the barrel, the bottom-side plunger and the top-side plunger being electrically connected to each other inside the barrel, the bottom-side plunger and the top-side plunger being electrically insulated from the barrel; and
a probe head including a combined guide plate having a conductive region made of a conductive material and an insulating region made of an insulating material arranged adjacent to each other in a planar view, the probe head holding the insulating probe in a state in which the barrel penetrates through the conductive region;
wherein the barrel of the insulating probe is connected to a ground potential via the conductive region when the inspection object is measured;
wherein the probe head has a structure in which a plurality of guide plates including the combined guide plate and an insulating guide plate entirely made of an insulating material are arranged in an axial direction of the insulating probe; and
wherein the probe head has the structure in which:
a bottom guide plate arranged on a bottom side is the insulating guide plate;
a top guide plate arranged on a top side is the combined guide plate; and
a middle guide plate of a plurality of middle guide plates arranged closest to the bottom guide plate is the combined guide plate, the plurality of middle guide plates being interposed between the bottom guide plate and the top guide plate.

* * * * *